United States Patent [19]

Holt, Jr.

[11] 3,898,482

[45] Aug. 5, 1975

[54] NOISE SUPPRESSION CIRCUIT

[75] Inventor: James G. Holt, Jr., Mountain View, Calif.

[73] Assignee: Fairchild Camera and Instrument Corporation, Mountain View, Calif.

[22] Filed: Mar. 29, 1974

[21] Appl. No.: 456,326

[52] U.S. Cl. .............. 307/237; 330/38 M; 307/243; 328/240

[51] Int. Cl.$^2$ .......................................... H03K 5/08

[58] Field of Search........ 307/229, 237, 243, 235 R; 328/240

[56] References Cited

UNITED STATES PATENTS

| | | | |
|---|---|---|---|
| 3,624,288 | 11/1971 | Hofmann | 307/237 X |
| 3,746,885 | 7/1973 | Stopper | 307/237 X |

*Primary Examiner*—Nathan Kaufman

*Attorney, Agent, or Firm*—Alan H. MacPherson; J. Ronald Richbourg

[57] ABSTRACT

An improved noise suppression circuit which includes a first transistor having a collector, an emitter coupled to the input of the circuit, and a base coupled to an output of the circuit through an impedance means. The circuit includes a second transistor having a base coupled to the collector of the first transistor, a collector coupled to a reference potential, and an emitter integral with the impedance means. The circuit of the present invention can be constructed to suppress positive-going noise pulses, negative-going noise pulses, or one of each can be cascaded to suppress both positive and negative-going noise pulses.

13 Claims, 5 Drawing Figures

NOISE SUPPRESSION CIRCUIT

BACKGROUND OF THE INVENTION

1. Field of the Invention

This invention relates to noise suppression circuits and, in particular, to a noise suppression circuit capable of operating effectively to suppress noise pulses occurring for long durations at fast rates.

2. Description of the Prior Art

Noise suppression circuits are used in a variety of applications ranging from automotive circuits to computer circuits where the presence of noise is likely to result in spurious operation of the equipment. A commonly used noise suppression circuit comprises a transistor switch coupling the input lead of an electrical circuit to a reference or ground potential. The prior art transistor switch is arranged for shunting noise spikes to ground, while remaining non-conductive in response to the desired input signals to the circuit. A disadvantage of this prior art noise suppression circuit is that the base-collector junction capacitance of the noise-suppression transistor, which charges in proportion to the potential of the input signal, follows the potential of the noise spikes. Thus, the prior art noise suppression circuit, which in essence is a low pass filter, does not function satisfactorily for shunting to ground noise spikes which occur at a rate faster than the discharge time of the capacitor. Therefore, a problem with this prior art active low pass filter circuit is that the charge accumulated on the base-collector junction capacitor is in proportion to, or follows, the voltage of the input noise. When this capacitor is charged above the threshold votage of the working circuit coupled to the noise suppression circuit, the active filter will not prevent a noise spike from activating the working circuit until the base-collector junction capacitance is discharged.

In U.S. Pat. No. 2,860,260 entitled "Transistor Integrator" by L. Sykes, a voltage integrator circuit is disclosed which employs silicon high-alpha junction transistors. This prior art circuit performs the function of suppressing noise pulses; however, it has the disadvantage of a slow discharge rate. This results in an accumulation of charge across a capacitor in response to noise pulses occurring at a high rate which will cause the working circuit to operate erroneously. Also, this prior art voltage integrator circuit will only operate with a low threshold voltage at the input of the working circuit. Therefore, this circuit is unsatisfactory as a noise suppression circuit where a normally low threshold voltage on the input of the working circuit is susceptible to high voltage noise spikes.

In U.S. Pat. No. 3,816,762 entitled "Noise Suppression Circuit" by James G. Holt, Jr., which issued June 11, 1974 and assigned to the same assignee as the present invention, a noise suppression circuit was disclosed. The circuit disclosed in this application is an improvement over the circuit disclosed in the above-cited U.S. Pat. No. 3,816,762.

SUMMARY OF THE INVENTION

In accordance with this invention, a noise suppression circuit is provided which comprises an input means and an output means; a first transistor having a collector, an emitter coupled to the input means of the circuit, and a base coupled to the input of a working circuit through an impedance means; and, a second transistor having a base coupled to the collector of the first transistor, a collector coupled to a reference potential, and an emitter integral with an impedance means.

The circuit of this invention is capable to being implemented using monolithic semiconductor integrated circuit techniques.

The circuit of the present invention can be constructed to suppress positive-going noise pulses, negative-going noise pulses, or one of each can be cascaded to suppress both positive and negative-going noise pulses.

In accordance with another embodiment of this invention, two noise suppression circuits are cascaded to suppress noise of both positive and negative polarity. A first of these cascaded circuits suppresses positive-going noise pulses, and the second circuit suppresses negative-going noise pulses. A switching means is coupled between the two cascaded circuits to disable the first circuit when the input signal is at a high level and there is a possibility of negative-going noise pulses on the input lead of the circuit.

DETAILED DESCRIPTION

Figure 1:
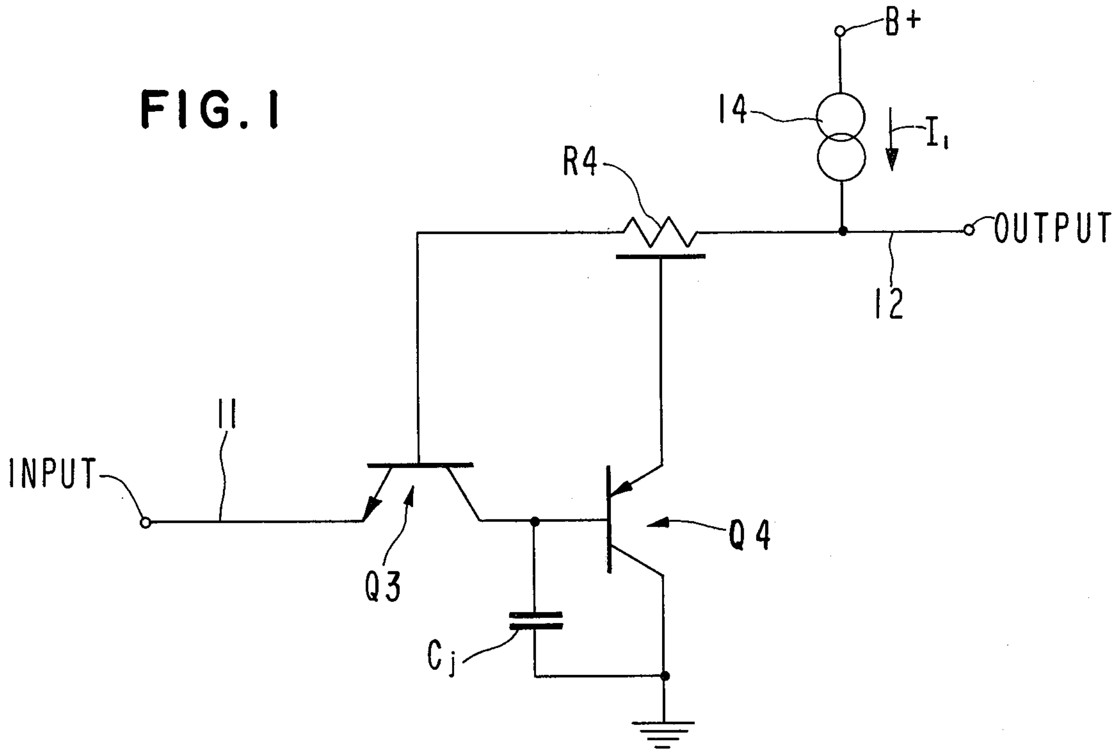
FIG. 1 is a schematic drawing of the noise suppression circuit of this invention.

With reference to FIG. 1, a schematic diagram of the present invention is illustrated. The input to the circuit is shown schematically as input lead 11, which is connected to the emitter of an NPN transistor Q3. The base of transistor Q3 is coupled to one terminal of a resistor R4. Resistor R4, as will be described later in a description of a solid state semiconductor implementation of the circuit shown in FIG. 1, is a diffused resistor which also serves as the emitter of a PNP transistor Q4.

The collector of transistor Q3 is connected to the base of the transistor Q4, and the collector of Q4 is connected to reference or ground potential. A capacitance $C_j$ couples the base of transistor Q4 to ground, which capacitance is formed from the junction associated with the collector-base junction of transistor Q4. An additional capacitance may be added in parallel with capacitor $C_j$ if desired. Output lead 12 is coupled to the other terminal of resistor R4, and is attached to the input of a working circuit (not shown). The working circuit is the circuit to be operated by the signal transmitted to input lead 11, and passed through transistors Q3 and Q4, resistor R4, and the output lead 12.

A current source 14 is connected between a positive voltage supply (B+) and output lead 12, for producing a current $I_1$. The current source 14 may comprise the supply voltage (B+) together with, for example, a resistor. If a resistor and B+ are used for the current source 14, it would not provide a constant current. However, other conventional current sources of appropriate design can be used which do provide constant current if desired.

The polarity of transistors Q3 and Q4 may be reversed, if desired, wherein Q3 is a PNP transistor and Q4 is an NPN transistor. If such a reversal of polarity is desired, the collector of Q4 is connected to B+ in lieu of ground potential. Also, in the configuration of FIG. 1 with the polarity shown, a negative voltage may be coupled to the collector of Q4 in lieu of ground potential, if desired, for a particular implementation.

The circuit shown in FIG. 1 operates in response to the application of a low-level logic signal, or ground potential, on input lead 11. Transistor Q3 is placed in saturation by the current $I_1$ from the current source 14. A positive noise pulse appearing on input lead 11 reverse biases NPN transistor Q3.

In particular, a low-level logic signal, or ground potential, applied on input lead 11 is transmitted through the saturated transistor Q3 to the base of transistor Q4. Transistor Q4 turns on, and the low-level signal, or ground potential, is transmitted to output lead 12. A positive noise pulse appearing on input lead 11 charges capacitor $C_j$ from 0.1 volts to a positive voltage which is limited in value by the amplitude of the current from the current source 14 and the voltage drop across the PN junctions of transistors Q3 and Q4. The positive noise pulse appearing on input lead 11 produces a slow-changing ramp voltage on the output lead 12, and this ramp voltage may be expressed by the following equation:

$$\frac{dV}{dt} = \frac{I_1}{(\beta_{Q4}) \cdot (C_j)} \qquad [1]$$

($I_1$ is the current from source 14, $\beta_{Q4}$ is the current gain of transistor Q4, and $C_j$ is the capacitance associated with the collector-base junction of the transistor Q4).

When the positive noise pulse first appears, during the time that the input signal is at a low level, the voltage on the output lead 12 is equal to approximately 0.7 volts (the 0.1 volt collector-to-emitter voltage drop across transistor Q3, and 0.6 volt base-to-emitter voltage drop across transistor Q4). The rate at which the voltage increases on output lead 12 is the same rate that voltage increases across capacitor $C_j$. As the voltage across capacitor $C_j$ increases from 0.1 volts, the voltage on output lead 12 increases from 0.7 volts to a positive value determined by the current source 14. When the positive pulse on input lead 11 disappears, capacitor $C_j$ discharges through transistor Q3. Therefore, since the voltage drop across the collector-emitter of transistor Q3 is equal to 0.1 volts, the voltage across the capacitor $C_j$ discharges to 0.1 volts (equal to the collector-to-emittervoltage drop across Q3).

Figure 2:
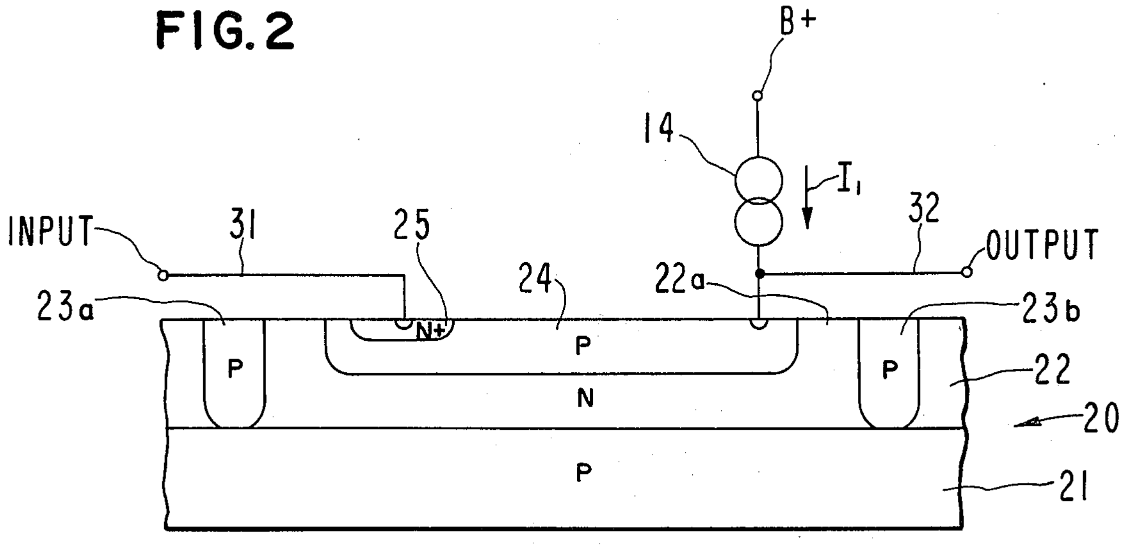
FIG. 2 shows a cross section of an integrated implementation of the circuit shown in FIG. 1.

FIG. 2 shows a cross section of a semiconductor embodiment of the circuit shown in FIG. 1. Substrate 21, typically P type silicon as shown, has formed thereon an N type epitaxial layer 22. Hereinafter, substrate 21 and the epitaxial layer 22 formed thereon will be referred to as die 20. Regions of the N type epitaxial layer 22, such as region 22a, are electrically isolated from adjacent regions thereof by the formation of diffused P type isolation regions of which cross sections 23*a* and 23*b* are shown. These diffused isolation regions extend from the surface of N type epitaxial layer 22 through the epitaxial layer to the surface of the P type substrate 21.

A P type region 24 is formed on one portion of the N type region 22*a* adjacent to the top surface of the epitaxial layer 22. Heavily doped N type region 25 is then formed within the P type region 24 and adjacent to the top surface of the region 24. Electrical lead 31, which corresponds to input lead 11 of the noise suppression circuit (FIG. 1), makes ohmic contact with a portion of the N type region 25. The NPN transistor corresponding to transistor Q3 (FIG. 1) comprises emitter region 25, base region 24, and collector region 22*a*, respectively.

Output lead 32, corresponding to the lead 12 of FIG. 1, makes ohmic contact with a portion of the P type region 24. Current source 14 is connected between output lead 32 and a positive voltage source (B+). The diffused P type base region 24 also constitutes the resistor R4. The PNP transistor Q4 comprises an emitter region which is integral with the base region 24 and the resistor R4, base region 22*a*, and collector region 21, respectively. The collector of transistor Q3 is automatically coupled to the base of transistor Q4 because both regions comprise a common N type region 22*a*. The capacitor $C_j$ is formed by the junction between the N type epitaxial layer 22 and the P type substrate 21.

Charge stored on the capacitor $C_j$ is discharged through the regions 22a, 24 and 25; that is, through the three regions which constitute the transistor Q3.

Figure 3:
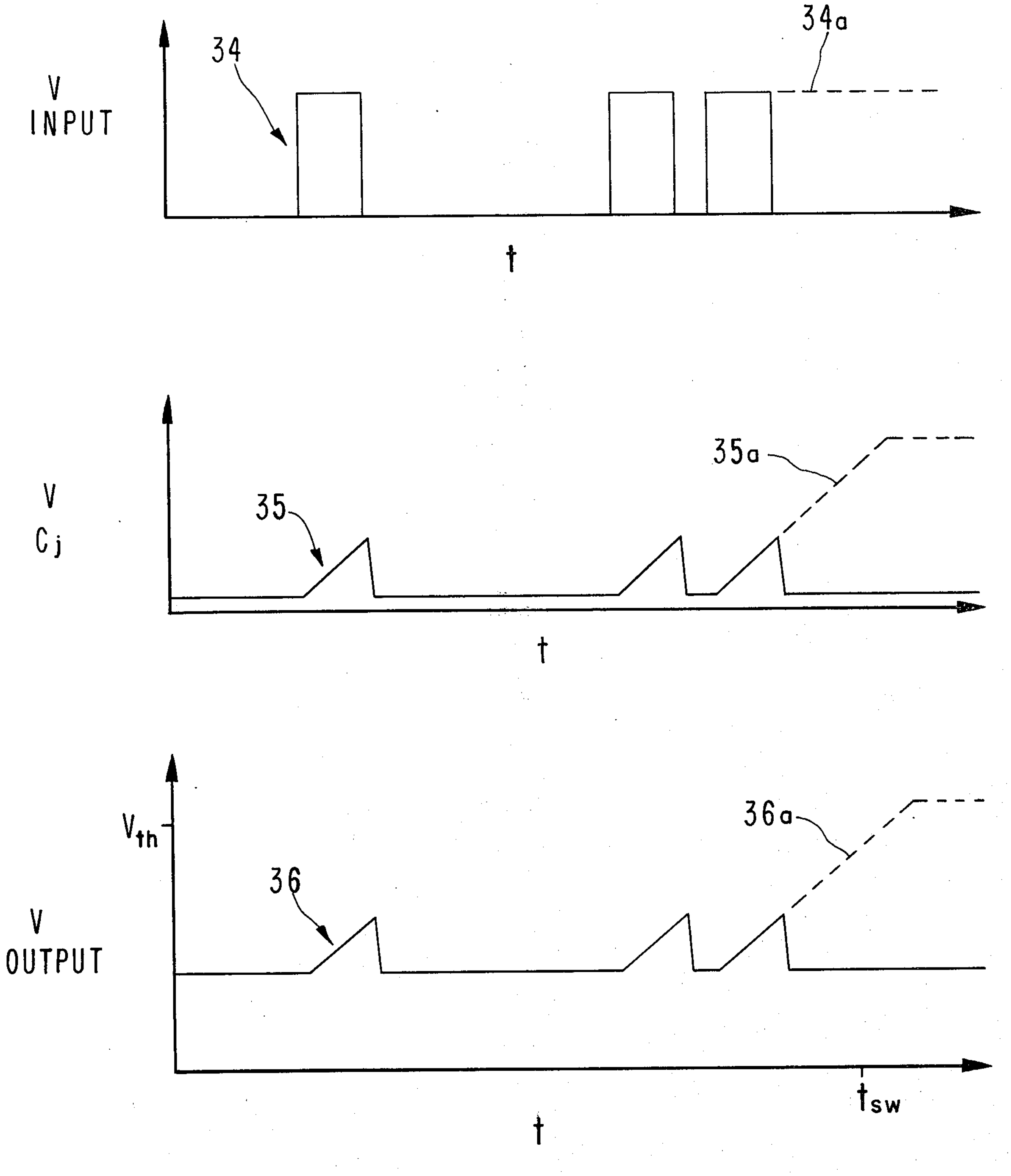
FIG. 3 is a timing diagram for the circuit shown in FIG. 1.

With reference to FIG. 3, a timing diagram of the circuit illustrated in FIG. 1 is shown. The ordinate of each of the three waveforms of FIG. 3 represents voltage, and the abscissa of each of the three waveforms represents time. Waveform 34 represents positive-going noise pulses which may appear on the input lead 11. Waveform 35 represents the voltage appearing across the capacitor $C_j$ in response to the noise pulses depicted by waveform 34. Waveform 36 represents the voltage appearing on the output lead 12 in response to the positive-going noise pulses as depicted by waveform 34. Assume, for example, that the third consecutive positive-going noise pulse remains at a high level for a longer period of time (i.e. as depicted by the dashed line extension 34*a*). Such an extended positivegoing signal represents a valid switching signal to be transmitted to the working circuit at the output. In response to the extended positive-going signal 34*a*, the voltage across capacitor $C_j$ increases in magnitude to that limited by the current $I_1$ supplied by the current source 14. This increase in voltage across the capacitor $C_j$ is depicted by the dashed line extension 35*a* of the third consecutive noise pulse of the waveform 35. Likewise, the voltage level on the output lead 12 increases in magnitude as represented by the dashed line extension 36*a* of the waveform 36. When the extended waveform 36*a* (in response to a valid switching signal) reaches the threshold voltage level of the working circuit, as represented by the level $V_{th}$, the working circuit is operated. The time at which this threshold voltage level is reached is represented on the abscissa by time $t_{sw}$.

Accordingly, the noise suppression circuit illustrated in FIG. 1 suppresses positive-going noise pulses which would erroneously operate the working circuit. At the same time, the noise suppression circuit is compatible with a working circuit wherein the threshold voltage is set at a level which is substantially above that of the suppressed noise pulses.

Figure 4:
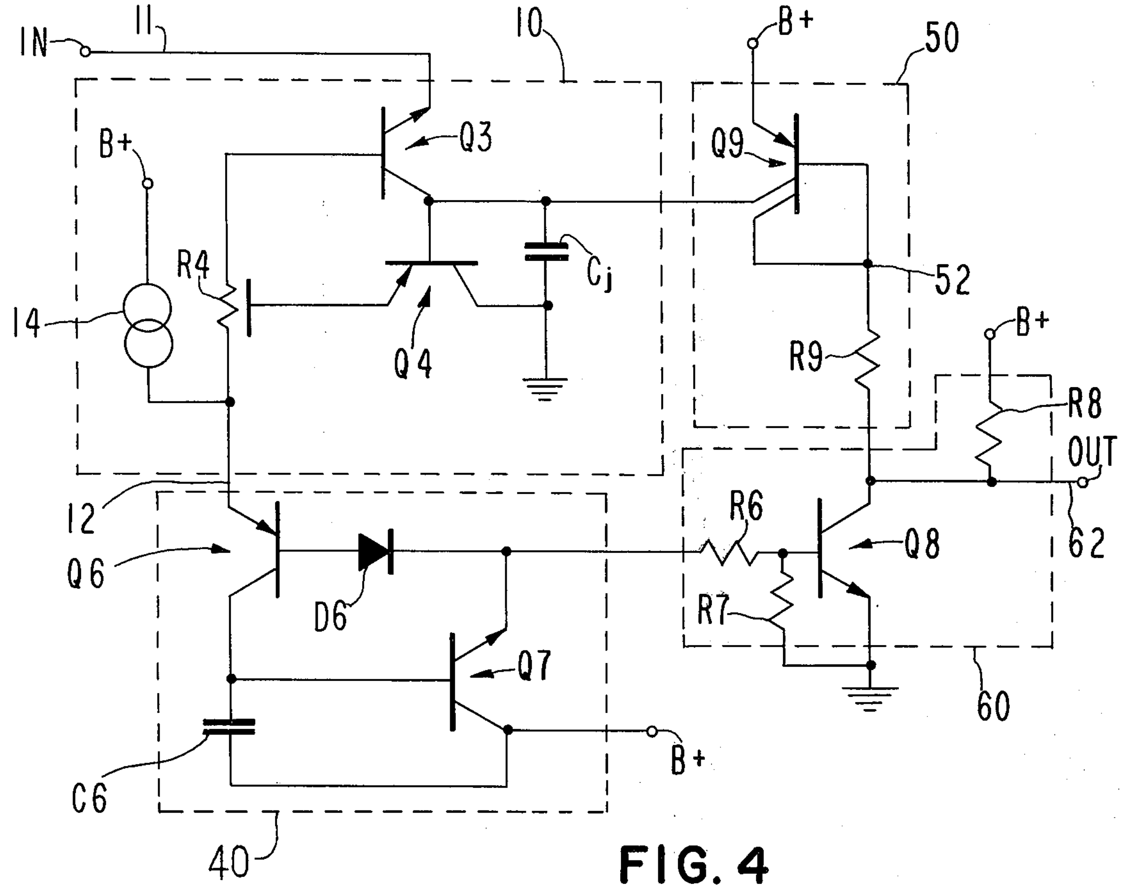
FIG. 4 is a schematic diagram of cascaded noise suppression circuits for positive and negative going noise pulses; and, FIG. 5 is a timing diagram for the circuit shown in FIG. 4.

With reference to FIG. 4, a schematic diagram of two cascaded noise suppression circuits for positive and negative-going noise pulses is shown. The portion of the circuit illustrated within dashed line 10 constitutes the same circuit illustrated in FIG. 1, like reference numerals are used. The circuit portion 10 suppresses positive-going noise pulses, and the portion of the circuit enclosed within the dashed line 40 suppresses negative-going noise pulses. The portion of the circuit enclosed within the dashed line 50 is a switching circuit, and the portion of the circuit illustrated within the dashed line 60 is an inverter used as an example of the working circuit.

The output lead 12 from the circuit portion 10 is connected to the emitter of a transistor Q6 within the circuit portion 40. The collector of the transistor Q6 is connected to one terminal of a capacitor C6, and to the base of a transistor Q7. The base terminal of the transistor Q6 is connected to the anode of a diode D6, and the cathode of D6 is connected to the emitter of the transistor Q7. The collector of transistor Q7 is connected to the voltage supply (B+), and to the other side of the capacitor C6. Capacitor C6 may comprise the base-collector capacitance of the transistor Q6, which capacitance is formed in the same manner as the capacitor $C_j$ described hereinabove.

The cathode of diode D6 and the emitter of the transistor Q7, which are coupled together, are connected to one side of a resistor R6. The second side of the resistor R6 is coupled to the base terminal of a transistor Q8 within the circuit portion 60. Also, a resistor R7 is coupled between the base of transistor Q8 and ground potential. The emitter of the transistor Q8 is connected to ground potential, and the collector of the transistor Q8 is coupled to an output lead 62. A resistor R8 is coupled between a source of positive voltage (B+) and the output lead 62. However, a current source may be used in lieu of the resistor R8.

The circuit portion 50 comprises a switching means that disables the circuit portion 10 when the output signal is at a low level, which is during the time that negative-going noise pulses may occur.

The collector terminal of the transistor Q3, within the circuit portion 10, is coupled to a first of two collectors of a transistor Q9 within the circuit portion 50. The emitter terminal of the transistor Q9 is coupled to a voltage supply (B+). The second collector of the transistor Q9 is coupled to the base terminal of the transistor Q9 at a circuit point 52. The circuit point 52 is coupled to one side of the resistor R9, and the second side of resistor R9 is coupled to the collector terminal of the transistor Q8.

The circuit portion 40 is the inverse (i.e., substantial dual) of the circuit portion 10. That is, transistor Q6 is a PNP transistor, which corresponds to the NPN transistor Q3, and transistor Q7 is an NPN transistor which corresponds to the PNP transistor Q4. Resistor R6 is diffused separately from the emitter of the corresponding transistor due to the fact that a diffused resistor comprises P type material and the emitter of the NPN transistor Q7 comprises N type material. Diode D6 is added to provide a 0.6 voltage drop between the base of transistor Q6 and the emitter of transistor Q7, which lowers the emitter voltage of Q7 to prevent transistor Q6 from saturating. However, other circuit components, such as a resistor, may be employed in lieu of the diode D6 for this purpose.

The circuit portion 40 may be employed independent of the complementary circuitry shown in FIG. 4 for suppressing negative-going noise pulses.

The operation of the circuit portion 10 is the same as that described hereinabove, and the output signal is supplied via output lead 12 to the emitter of transistor Q6. Assuming that the signal supplied on output lead 12 does not contain negative-going noise pulses, then the output signal from circuit portion 10 will pass through transistor Q6, diode D6, resistor R6, to the base of the transistor Q8. In response to this signal, an output signal (inverted from the input signal) is supplied on output lead 62.

Transistor Q9 is turned ON when a low-level signal on the output lead 62 is coupled through resistor R9 to the base terminal of the transistor Q9. When transistor Q9 turns ON a charge accumulates across the capacitor $C_j$. The charge accumulated across capacitor $C_j$ will hold transistor Q4 in an OFF state. Under this condition, the base terminal of transistor Q3 follows or tracks the signal provided on the input lead 11; however, the base of Q3 is one base-emitter voltage drop ($1V_{BE}$) above the level on input lead 11. Therefore, a high-level signal supplied on the input lead 11 is coupled through the transistor Q3, increased by $1V_{BE}$, and supplied through the resistor R4 to the emitter terminal of transistor Q6.

The circuit portion 40 is provided for detecting negative-going noise pulses. The high-level signal supplied from circuit 10 via output lead 12 forward biases the base-emitter terminals of transistor Q6. Current is therefore supplied from the emitter terminal of transistor Q6 to the collector terminal and is coupled to the base terminal of transistor Q7. The same current in response to the high-level signal provided on the lead 12 of circuit 10 is coupled through the emitter terminal of transistor Q7 and the resistor network comprising resistors R6 and R7 of the circuit portion 60, which subsequently turns ON the transistor Q8. This will provide a low-level output signal on output lead 62. During the time that current is supplied through the transistor Q6, charge accumulates across the capacitor C6.

Assume, for example, that a negative-going noise pulse is supplied on the input lead 11, which negative-going noise pulse is coupled through transistor Q3, resistor R4, and appears at the emitter terminal of the transistor Q6. This negative-going noise pulse will reverse bias the emitter-base junction of the transistor Q6. However, the charge across capacitor C6 holds the transistor Q7 in an ON state, and is coupled through the base-emitter junction of the transistor Q7 to hold the transistor Q8 in an ON state. The base of the transistor Q8 is drawing current via the above described path, which current slowly discharges the capacitor C6. That is, the current drawn by the transistor Q8 is divided by a large beta value of the transistor Q7, which discharges capacitor C6 at an extremely slow rate. The time required to discharge capacitor C6 to a level which will turn OFF the transistors Q7 and Q8 constitutes a time delay between input signal change and output signal switching. This time delay depends upon the constituent components selected for the circuit.

When a negative-going signal is supplied on input lead 11, and it is a legitimate switching signal, the transistors Q7 and Q8 will turn OFF following the time delay required to discharge the capacitor C6. Once the transistor Q8 turns off, the voltage supply (B+) is coupled through the resistor R8 to the output lead 62. The collector of the transistor Q8 goes to a high level when Q8 is turned OFF. This high-level signal is also coupled through resistor R9 to the base terminal of the transistor Q9, which will turn OFF transistor Q9, and enables the circuit 10. Accordingly, if the input signal is at a low-level state following a switch, any noise pulses which may be undesirable will be positive-going noise pulses.

The provision of two collectors for the transistor Q9, which two collectors are identical in size, allows current "mirrowing" of each collector. That is, the amount of current flowing through the first collector of Q9 is equal to the amount of current flowing through the second collector of Q9. Therefore, the amount of current drawn through resistor R9 is equal to the amount of current supplied to the capacitor $C_j$. The amount of current from the base of the transistor Q9 is negligible when compared to the amount of current from the collectors thereof. Therefore, the current through resistor R9 is substantially equal to the current supplied to the capacitor $C_j$. However, a transistor having a single collector may be employed in lieu of the double collector transistor Q9. If such a single collector transistor is used for Q9, then it is necessary to couple a pull-up resistor (not shown) between the emitter terminal and the base terminal of the transistor Q9. Also, any switching means which will disable circuit portion 10 at a time when the input signal is at a high level will be satisfactory in lieu of the particular circuit 50 illustrated. When a switching circuit similar to that illustrated in circuit 50 is employed, an inversion stage is required such as the transistor Q8, However, if a different type of switching means (circuit 50) is employed, the signal supplied through the resistor R9 may be provided at a different circuit point as, for example, the emitter of the transistor Q7.

Figure 5:
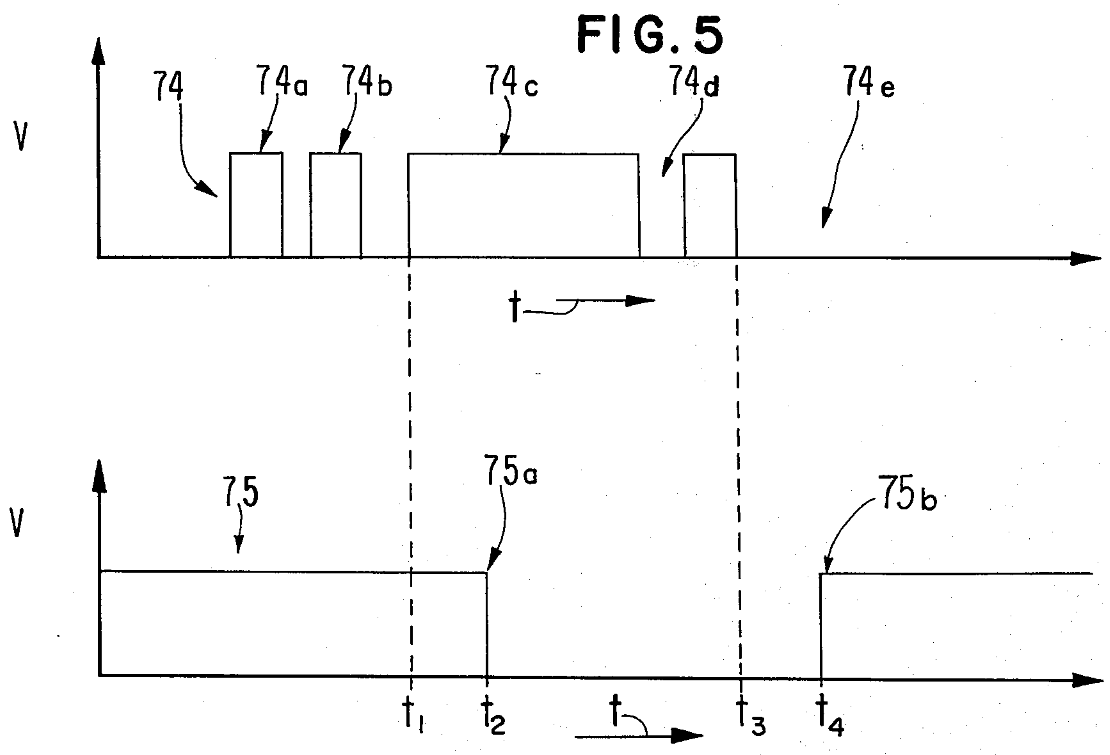

With reference FIG. 5, a timing diagram for the circuit shown in FIG. 4 is illustrated. Waveform 74 represents the input signal supplied on the input lead 11. Portions 74*a* and 74*b* represent positive-going noise pulses, wherein portion 74*c* represents a legitimate switching signal. Portion 74*d* represents a negative-going noise pulse, and portion 74e represents a legitimate negative-going switching signal. Waveform 75 represents the output signal provided an output lead 62 in response to the input signal depicted by waveform 75. Edge 75*a* of waveform 75 is delayed in time ($t_1$ to $t_2$, FIG. 5) from the leading edge of the portion 74*c* by the amount of time required to charge the capacitor $C_j$ as described hereinabove. Likewise, edge 75*b* of waveform 75 is delayed in time ($t_3$ to $t_4$, FIG. 5) from the leading edge of the portion 74*e*, which time delay is determined by the amount of time required to discharge the capacitor C6.

What is claimed is:

1. A noise suppression circuit comprising in combination:

a. an input means and an output means;

b. a first transistor having a collector, an emitter coupled to said input means, and a base coupled to a first impedance means;

c. a second transistor having a base coupled to said collector of said first transistor, a collector coupled to a first reference potential, and an emitter integral with said first impedance means;

d. a third transistor having an emitter coupled to said first impedance means, a collector, and a base coupled to a second impedance means;

e. a fourth transistor having an emitter coupled to said second impedance means, and said output means, a base coupled to the collector of said third transistor, and a collector coupled to a second reference potential; and f. a switching means coupled between said output means and said base of said second transistor, and such that said second transistor is enabled for a first state of said output means and disabled for a second state of said output means.

2. A circuit as defined in claim 1 further including a first charge storage means coupled between said base and said collector of said second transistor.

3. A circuit as defined in claim 1 further including a second charge storage means coupled between said base and said collector of said fourth transistor.

4. A circuit as defined in claim 1 wherein said first and said fourth transistors are NPN transistors, and said second and said third transistors are PNP transistors.

5. A circuit as defined in claim 4 wherein said first reference potential is ground and said second reference potential is a positive voltage.

6. A circuit as defined in claim 1 wherein said second impedance means is a diode.

7. A circuit as defined in claim 1 wherein said switching means is a transistor having a base said coupled to said output means, a collector coupled to said base of said second transistor, and an emitter coupled to a positive voltage.

8. Semiconductor structure comprising:

a. a substrate of semiconductor material of a first conductivity type;

b. a layer of monocrystalline semiconductor material of a second conductivity type formed on said substrate;

c. a first region of said first conductivity type formed in said layer of semiconductor material adjacent the top surface of said layer;

d. a second region of said second conductivity type formed in said first region;

e. an input lead coupled to said second region;

f. an output lead means coupled to said first region, whereby said first region comprises the base region of a first transistor, the emitter region of a second transistor, and a resistor between said input lead and said output lead.

9. Structure as defined in claim 8 wherein said first conductivity type is P conductivity and second conductivity type is N type conductivity.

10. Structure as defined in claim 8 wherein said semiconductor material is silicon.

11. A noise suppression circuit comprising in combination:

a. an input and an output means;

b. an NPN transistor having a collector region, an emitter region coupled to said input means, and a base region coupled to said output means through an impedance means;

c. a PNP transistor having a base region coupled to the collector region of said NPN transistor, a collector region coupled to ground potential, and an emitter region integral with said impedance means; and, d. a charge storage means coupled between the base and collector regions of said PNP transistor.

12. A noise suppression circuit having an input and an output, which comprises:

a. a PNP transistor having a collector region, an emitter region coupled to the input of said circuit, and a base region coupled to an impedance means;

b. an NPN transistor having a base region coupled to the collector region of said PNP transistor, a collector region coupled to a positive potential, and an emitter region coupled to said impedance means and to the output of said circuit; and, c. a charge storage means coupled between the base and collector regions of said NPN transistor.

13. A circuit as defined in claim 12 wherein said impedance means comprises a diode.

* * * * *